(12) United States Patent
Seto et al.

(10) Patent No.: US 7,394,707 B2
(45) Date of Patent: Jul. 1, 2008

(54) PROGRAMMABLE DATA STROBE ENABLE ARCHITECTURE FOR DDR MEMORY APPLICATIONS

(75) Inventors: Hui-Yin Seto, San Jose, CA (US); Derrick Sai-Tang Butt, San Leandro, CA (US)

(73) Assignee: LSI Corporation, Milpitas, CA (US)

( * ) Notice: Subject to any disclaimer, the term of this patent is extended or adjusted under 35 U.S.C. 154(b) by 567 days.

(21) Appl. No.: 11/166,292

(22) Filed: Jun. 24, 2005

(65) Prior Publication Data
US 2006/0291302 A1 Dec. 28, 2006

(51) Int. Cl.
*G11C 7/00* (2006.01)
(52) U.S. Cl. ........................ 365/193; 365/233; 365/194
(58) Field of Classification Search ................. 365/193, 365/194, 189.01, 189.02, 191, 233
See application file for complete search history.

(56) References Cited

U.S. PATENT DOCUMENTS

| 6,975,557 | B2* | 12/2005 | D'Luna et al. | ......... 365/233.13 |
| 7,185,173 | B2* | 2/2007 | Ho | ............................. 711/220 |
| 2005/0259505 | A1* | 11/2005 | Grand et al. | ................. 365/233 |
| 2006/0224847 | A1* | 10/2006 | Seto et al. | .................... 711/167 |
| 2006/0288175 | A1* | 12/2006 | Seto et al. | .................... 711/154 |

* cited by examiner

*Primary Examiner*—Gene N. Auduong
(74) *Attorney, Agent, or Firm*—Christopher P. Maiorana PC

(57) ABSTRACT

An apparatus comprising a first circuit, a second circuit and a third circuit. The first circuit may include a plurality of first multiplexers and one or more second multiplexers configured to generate a first intermediate enable signal in response to (i) an input enable signal, (ii) a first clock signal operating at a first data rate and (iii) a plurality of first select signals. The plurality of first multiplexers each present an output to each of the one or more second multiplexers. The second circuit may be configured to generate a second intermediate enable signal in response to (i) the first intermediate enable signal, (ii) a second clock signal operating at a second data rate and (iii) a second select signal. The third circuit may be configured to generate a third intermediate enable signal in response to (i) the second intermediate enable signal, (ii) a control input signal and (iii) a third select signal. The third intermediate enable signal may be configured to control a read operation of a memory.

20 Claims, 5 Drawing Sheets

US 7,394,707 B2

PROGRAMMABLE DATA STROBE ENABLE ARCHITECTURE FOR DDR MEMORY APPLICATIONS

CROSS REFERENCE TO RELATED APPLICATIONS

The present application may relate to co-pending U.S. application Ser. No. 11/097,903, filed Apr. 1, 2005 and U.S. application Ser. No. 11/154,401, filed Jun. 16, 2005, which are each hereby incorporated by reference in their entirety.

FIELD OF THE INVENTION

The present invention relates to memory systems generally and, more particularly, to a method and/or architecture for implementing a programmable data strobe signal that may be suitable for a DDR memory application.

BACKGROUND OF THE INVENTION

In conventional double data rate (DDR) memories, data and data strobe signals (i.e., DQS) are returned from a memory module during each read cycle. The data strobe signal DQS is a bidirectional signal. Noise or unwanted signal toggling may propagate into a memory controller when the controller is not actively reading data from the memory module. Referring to FIG. 1, an example of a circuit 10 illustrating a conventional data strobe architecture for double data rate (DDR) memory is shown. Conventional approaches lack a programmable coarse delay in a first data rate domain.

It would be desirable to implement a data strobe enable architecture suitable for use in a double data rate (DDR) memory application that provides a programmable coarse delay in a first data rate domain.

SUMMARY OF THE INVENTION

The present invention concerns an apparatus comprising a first circuit, a second circuit and a third circuit. The first circuit may include a plurality of first multiplexers and one or more second multiplexers configured to generate a first intermediate enable signal in response to (i) an input enable signal, (ii) a first clock signal operating at a first data rate and (iii) a plurality of first select signals. The plurality of first multiplexers each present an output to each of the one or more second multiplexers. The second circuit may be configured to generate a second intermediate enable signal in response to (i) the first intermediate enable signal, (ii) a second clock signal operating at a second data rate and (iii) a second select signal. The third circuit may be configured to generate a third intermediate enable signal in response to (i) the second intermediate enable signal, (ii) a control input signal and (iii) a third select signal. The third intermediate enable signal may be configured to control a read operation of a memory.

The objects, features and advantages of the present invention include implementing a memory architecture that may implement an enable feature for a data strobe signal that may (i) prevent unwanted toggles of a signal from propagating at unwanted times and/or (ii) provide a programmable enable signal.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
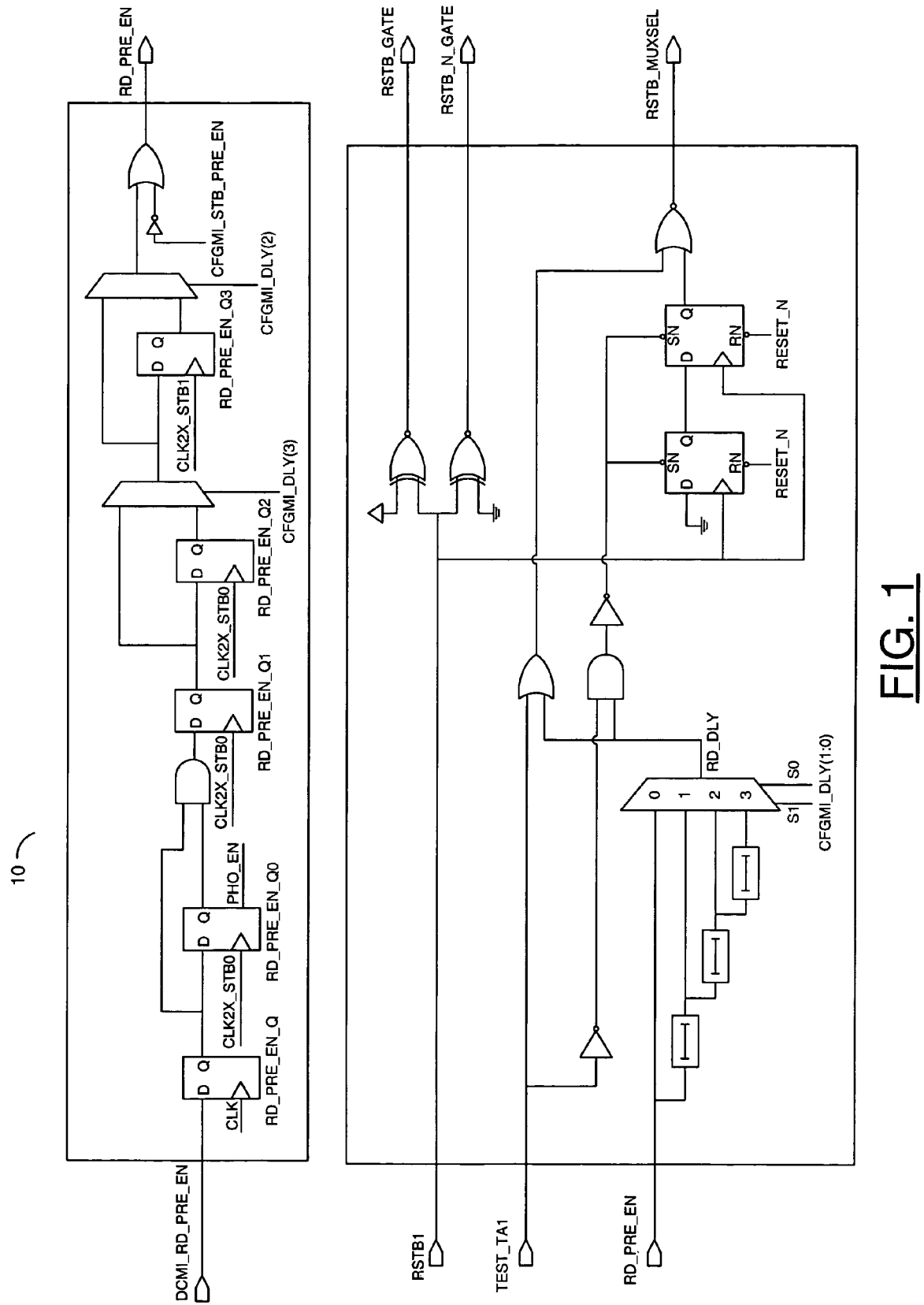
FIG. 1 is a detailed diagram illustrating a conventional circuit.
Figure 2:
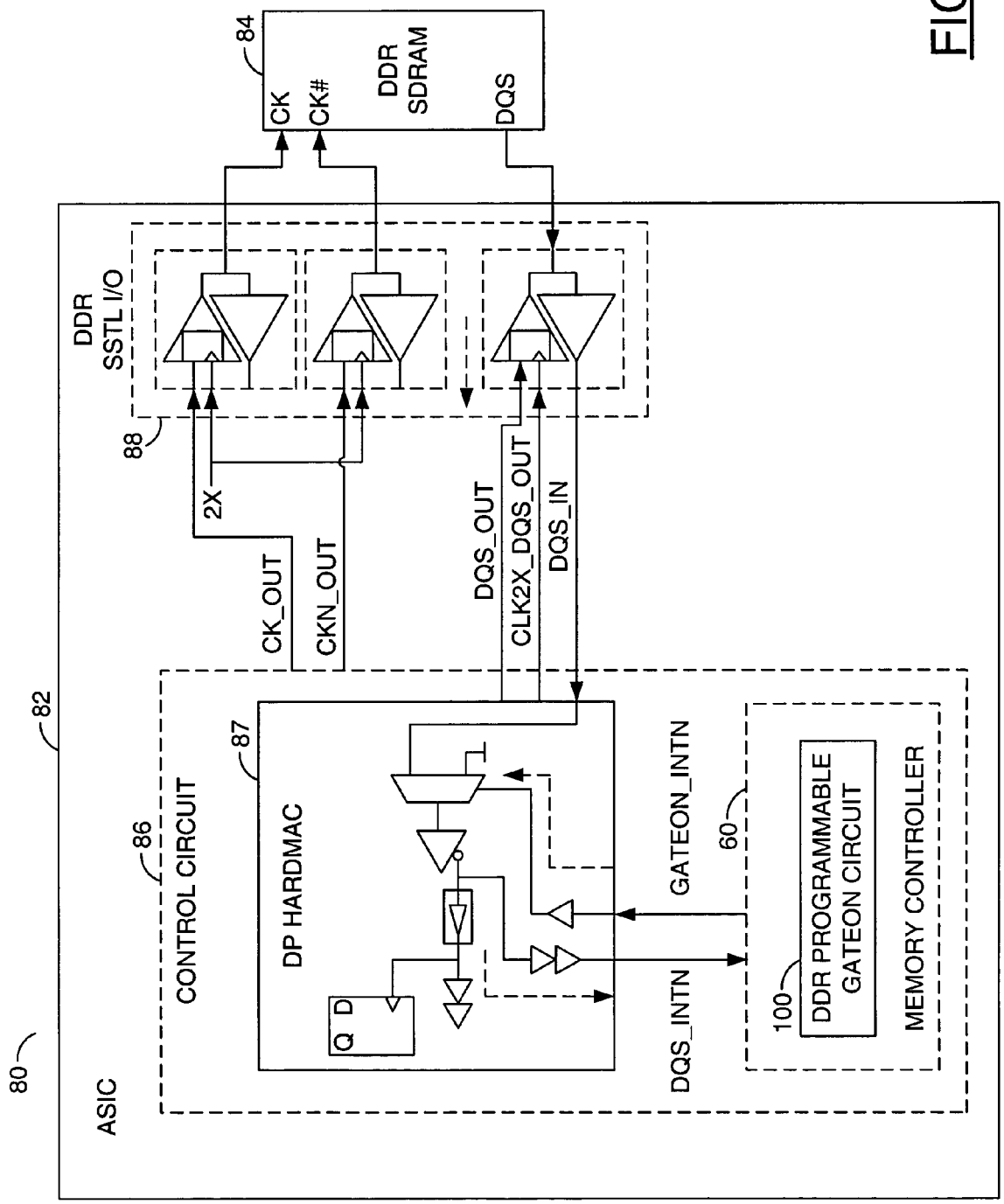
FIG. 2 is a block diagram of a memory controller.

Referring to FIG. 2, a block diagram of a circuit 80 is shown illustrating a context of the present invention. The circuit 80 generally comprises a circuit 82 and a memory 84. The circuit 82 may be implemented as an application specific integrated circuit (ASIC). The memory 84 may be implemented as a memory circuit, such as a double data rate (DDR) synchronous dynamic random access memory (SDRAM). However, other types of memories may be implemented to meet the design criteria of a particular implementation.

The circuit 82 generally comprises a control circuit 86 and a buffer circuit 88. The control circuit 86 generally comprises a hardmacro circuit 87 and a memory controller 60. In general, the control circuit 86 may be implemented as a mix of soft and hard macro functions configured to implement a memory control function. The memory controller 60 may be implemented as a memory controller, a memory application design, a memory interface design or other type of memory implementation. The memory controller 60 may include a programmable circuit 100. The programmable circuit 100 may be implemented as a DDR Programmable Gateon circuit. The hardmacro circuit 87 may be part of a data path. The hardmacro circuit 87 may include a number of multiplexers, gates and/or other circuitry. The hardmacro circuit 87 may be connected to the buffer circuit 88. While a single hardmacro circuit 87 is shown, a number of hardmacro circuits 87 are normally implemented to create a number of data paths from the circuit 82 to the memory 84. The hardmacro circuit 87 may present and/or receive a number of signals (e.g., DQS_OUT, CLK2X_DQS_OUT and/or DQS_IN) that may be referred to as a DQS path. The control circuit 86 may present a number of signals (e.g., CK_OUT and CKN_OUT) to the buffer circuit 88. The buffer 88 may be connected between the control circuit 86 and the memory 84. The hardmacro circuit 87 may present a signal (e.g., DQS_INTN) to the programmable circuit 100. The programmable circuit 100 may present a signal (e.g., GATEON_INTN) to the hardmacro circuit 87.

Figure 3:
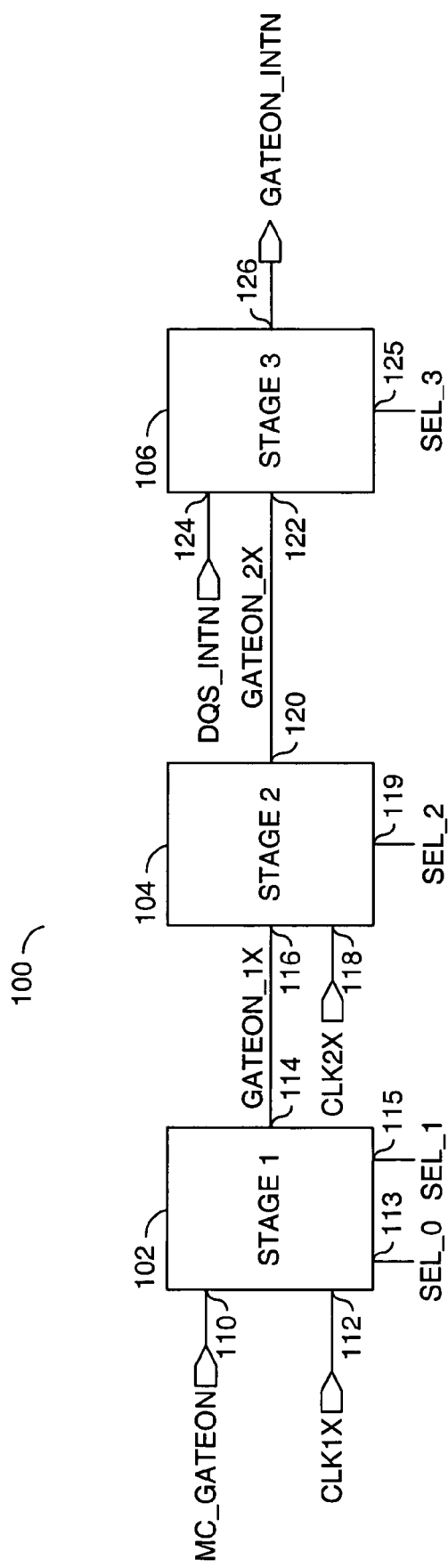
FIG. 3 is a block diagram of a preferred embodiment of the present invention.

Referring to FIG. 3, a block diagram of the circuit 100 is shown in accordance with a preferred embodiment of the present invention. The circuit 100 may be implemented as a data strobe enable architecture. The circuit 100 generally comprises a block (or circuit) 102, a block (or circuit) 104 and a block (or circuit) 106. The circuit 102 may be implemented as a first stage. The circuit 104 may be implemented as a second stage. The circuit 106 may be implemented as a third stage. The first stage 102 may have an input 110 that may receive a signal (e.g., MC_GATEON) and an input 112 that may receive a signal (e.g., CLK1X). The first stage 102 may also have an input 113 that may receive a select signal (e.g., SEL_0). The first stage 102 may also have an input 115 that may receive a select signal (e.g., SEL_1). The signal CLK1X may be implemented as a single speed clock signal. The first stage 102 may have an output 114 that may present a signal (e.g., GATEON_1X) to an input 116 of the second stage 104.

The second stage 104 may also have an input 118 that may receive a signal (e.g., CLK2X). The signal CLK2X may be implemented as a double speed clock signal. The signal CLK2X may be a multiple (e.g., 2X) of the signal CLK1X. The circuit 104 may have an input 119 that may receive a select signal (e.g., SEL_2). The second stage 104 may have an output 120 that may present a signal (e.g., GATEON_2X) to an input 122 of the third stage 106. The third stage 106 may also have an input 124 that may receive a signal (e.g., DQS_INTN). The third stage 106 may have an input 125 that may receive a signal (e.g., SEL_3). The third stage 106 may have an output 126 that may present a signal (e.g., GATEON_INTN).

The memory controller 60 asserts a normally "HIGH" on the data strobe enable signal (e.g., MC_GATEON) when issuing a READ command to a memory module. The signal MC_GATEON is normally generated internally to the memory controller 60. The signal MC_GATEON is then held HIGH by the first stage 102 for the entire burst of read operations. For example, for a read burst of 8, the signal MC_GATEON will generally be held HIGH for four clock cycles of the signal CLK1X. Three sets of delay adjustments (e.g., coarse, medium, and fine delays) with different granularities (e.g., 1, ¼, and 1/16 of a 1x clock cycle) may be provided to account for variations within the system 100 (e.g., CAS latency, I/O buffer delays, PCB flight time, cross-point skews of memory clocks, etc.). Other granularities may be implemented to meet the design criteria of a particular implementation. The circuit 100 is normally implemented as a self-timed circuit. The last falling edge of a data strobe signal (e.g., DQS) will turn off a read DQS path.

The data strobe signal DQS is normally implemented as a bidirectional signal. Noise or unwanted signal toggling may propagate into the memory controller 60 when the controller is not actively reading data from the memory device. To avoid unwanted noise, or false propagating of the signal DQS into the controller, the memory controller 60 should use the signal GATEON_INTN of each hardmacro circuit 87 to gate off the paths. It is generally desirable to gate off the READ DQS path when the memory controller 60 is not reading from the memory circuit 84.

Figure 4:
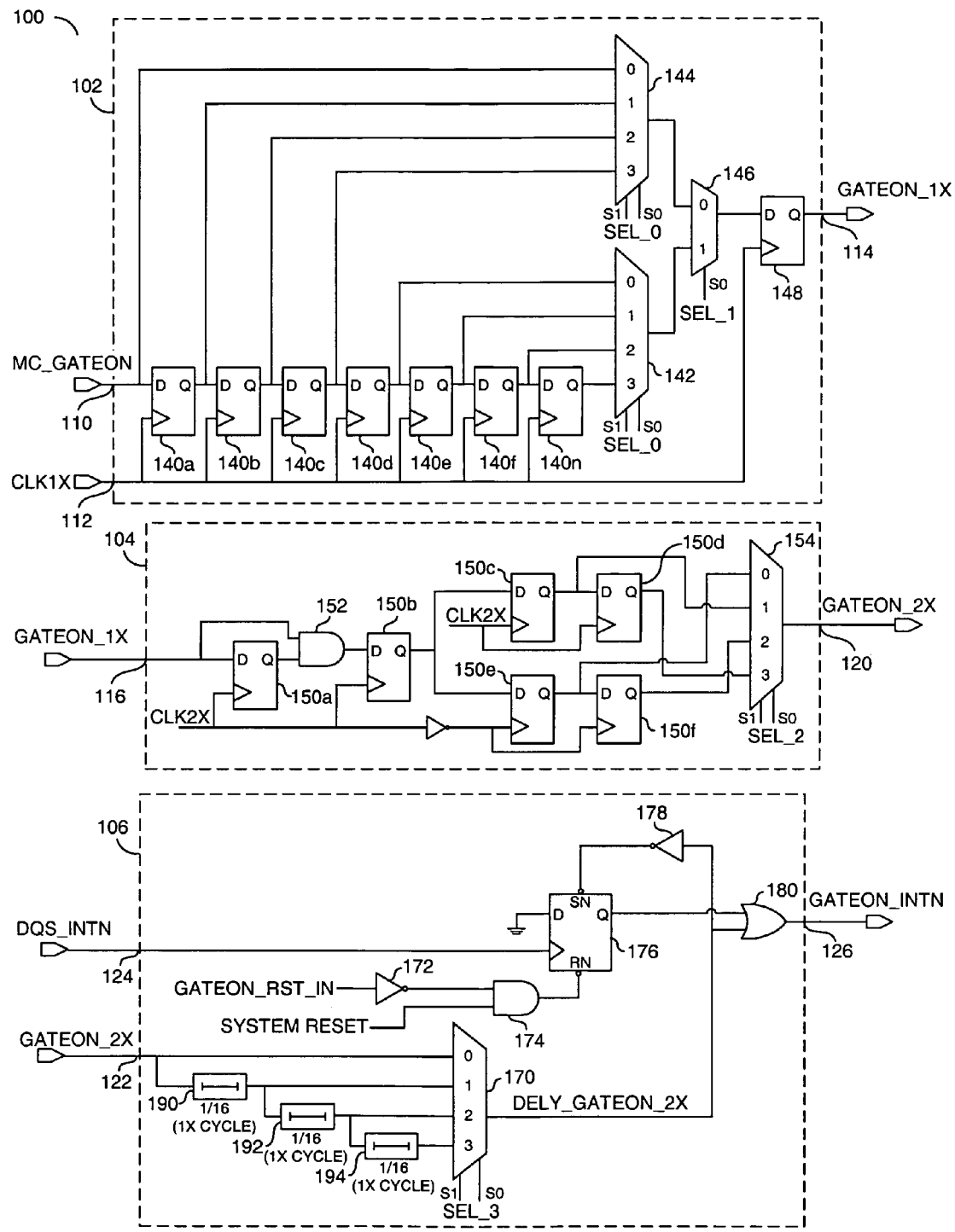
FIG. 4 is a more detailed diagram of the circuit of FIG. 3.

Referring to FIG. 4, a more detailed diagram of the circuit 100 is shown. FIG. 4 illustrates an example of a programmable gateon circuit that demonstrates the signal DQS gating during the pre- and post-amble phase of the read cycle. The first stage 102 generally comprises a number of flip-flops 140a-140n, a multiplexer 142, a multiplexer 144, a multiplexer 146 and a flip-flop 148. Each of the flip-flops 140a-140n presents a delay to the signal MC_GATEON. Additionally, each of the flip-flops 140a-140n are normally clocked by the clock signal CLK1X. The multiplexer 144 has a number of inputs labeled 0-3 that each receive a corresponding output from the flip-flops 140a-140c. For example, the input 0 may directly receive the signal MC_GATEON. The input 1 may receive a signal from the flip-flop 140a, the input 2 may receive a signal from the flip-flop 140b and the input 3 may receive a signal from the flip-flop 140c. Similarly, the multiplexer 142 has a number of inputs 0-3 that may receive signals from the flip-flops 140d-140n. For example, the input 0 may receive a signal from the flip-flop 140d. The input 1 may receive a signal from the flip-flop 140e, the input 2 may receive a signal from the flip-flop 140f and the input 3 may receive a signal from the flip-flop 140n. The particular number of flip-flops 140a-140n may be varied to meet the design criteria of a particular implementation. Additionally, the multiplexers 142 and 144 may implement a greater number or a lesser number of inputs 0-3 to meet the design criteria of a particular implementation. The select signal SEL_0 (e.g., the zero and first bits of the multi-bit select signal) generally presents signals to a select input S0 and a select input S1 of the multiplexer 142 and the multiplexer 144. The select inputs S0 and S1 control which of the inputs 0-3 may be presented at the output of the multiplexer 142 and the multiplexer 144.

The multiplexer 146 generally has an input 0 that receives a signal from the multiplexer 144 and an input 1 that receives a signal from the multiplexer 142. The multiplexer 146 has a select signal S0, that may be part of the signal SEL_1. The flip-flop 148 receives the signal from the multiplexer 146 and presents the signal GATEON_1X.

The second stage 104 generally comprises a number of flip-flops 150a-150f, a gate 152 and a multiplexer 154. The flip-flops 150a, 150b, 150c, 150d are generally clocked by the clock signal CLK2X. The flip-flops 150e and 150f are generally clocked by the inverse (e.g., 180 degrees out of phase) of the clock signal CLK2X (e.g., −CLK2X). The multiplexer 154 has a number of inputs 0-3 that receive signals from different flip-flops 150c-150f. The select signal SEL_2 provides the select signals S0 and S1 and allow the multiplexer 154 to present the signal GATEON_2X.

The third stage 106 generally comprises a multiplexer 170, an inverter 172, a gate 174, a flip-flop 176, an inverter 178 and a gate 180. The multiplexer 170 has a number of inputs 0-3 that receive different delayed versions of the signal GATEON_2X. The signal GATEON_2X is presented to an input 0 of the multiplexer 170. The signal GATEON_2X is also passed through a delay element 190, which then goes to the input 1 of the multiplexer 170. Similarly, a delay 192 is presented to an input 2 of the multiplexer 170. Similarly, a delay 194 is presented to an input 3 of the multiplexer 170. The select signal SEL_3 provides the select signal S0 and S1 and allow the multiplexer 170 to present a signal (e.g., DELY_GATEON_2X) to the gate 180. The signal DELY_GATEON_2X may be a delayed version of the signal GATEON_2X.

Figure 5:
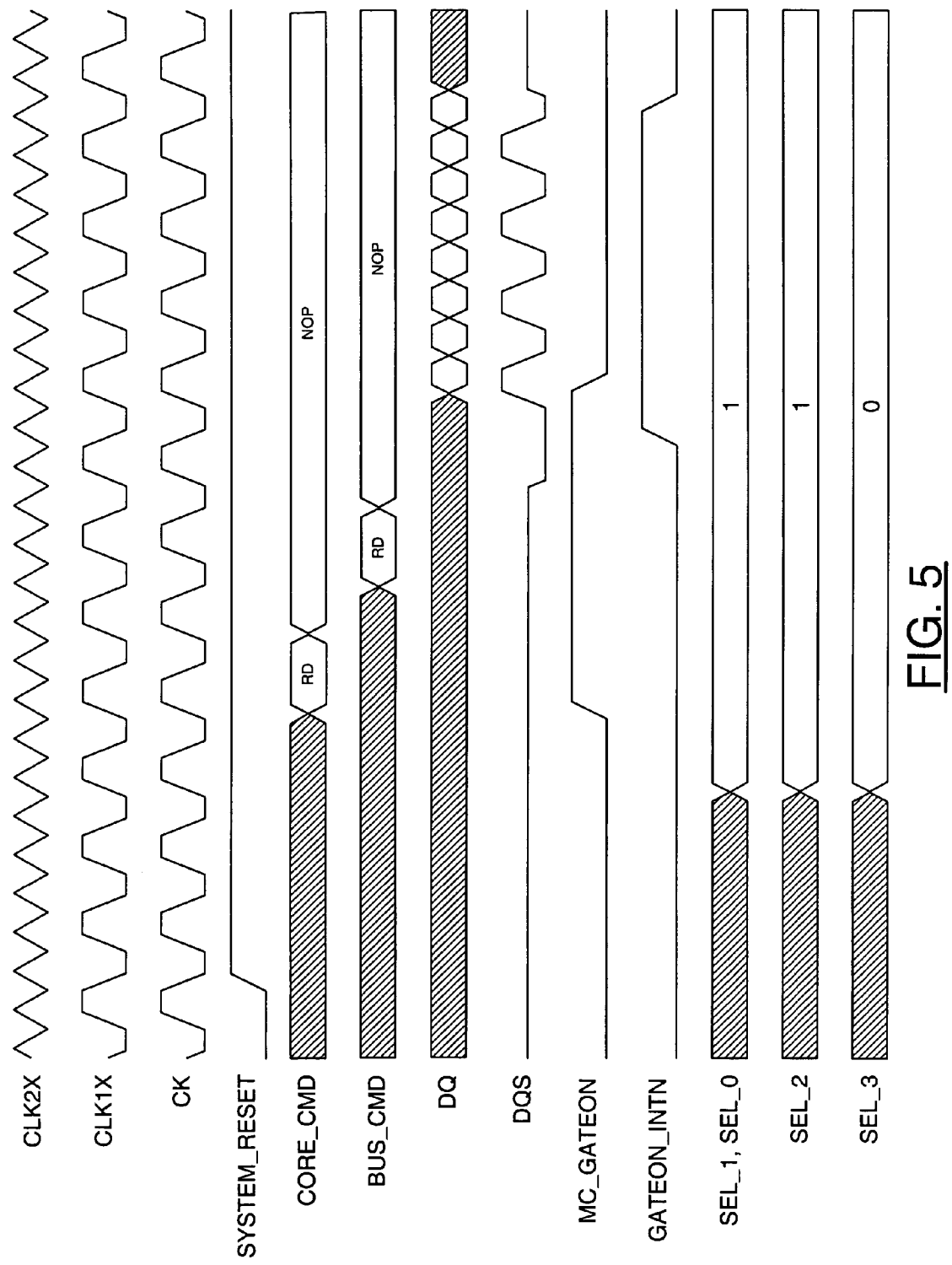
FIG. 5 is a timing diagram illustrating the assertion and deassertion of the enable signal.

Referring to FIG. 5, a timing diagram is shown illustrating the assertion and deassertion of the signal MC_GATEON. FIG. 5 also shows the clock signal CLK1X, the clock signal CLK2X, a clock signal CK, a system reset signal (e.g., SYSTEM_RESET), a signal CORE_CMD, a signal BUS_CMD, a signal DQ, the signal DQS, the signal MC_GATEON, the signal GATEON_INTN, the select signal SEL_0, the select signal SEL_1, the select signal SEL_2, and the select signal SEL_3.

The circuit 100 is normally implemented as a self-timed circuit. The last falling edge of the signal DQS will turn off the read DQS paths. Three sets of delay adjustments (e.g., coarse, medium, and fine delays) with different granularities (e.g., 1, ¼, and 1/16 of a 1x clock cycle) may be provided to account for propagation variations (e.g., CAS latency, I/O buffer delays, PCB flight time, crosspoint skews of CK/CK#, etc.). The coarse delay may be selected by the signal SEL_0 and the signal SEL_1. In one example, each delay step may be implemented as one 1x clock cycle. The medium delay may be selected by the signal SEL_2. Each medium delay step may provide 0.25 of a 1X clock cycle. The fine delay may be selected by the signal SEL_3. Each fine delay step may provide 0.0625 of a 1X clock cycle. The delay steps of 1, 0.25 and 0.0625 have been described as examples. Each delay step may be modified to meet the design criteria of a particular implementation.

The following TABLE 1 illustrates example delay settings for different CAS latencies without encountering I/O buffer delays, PCB flight time, crosspoint skews of the differential clock signal CK/CK#, etc.:

TABLE 1

| CAS latency | SEL_1, SEL_0 | SEL_2 | SEL_3 |
|---|---|---|---|
| 2 | 001 | 01 | 00 |
| 2.5 | 001 | 11 | 00 |
| 3 | 010 | 01 | 00 |
| 4 | 011 | 01 | 00 |
| 5 | 100 | 01 | 00 |

The CAS latency programming is normally controlled by the signals SEL_0 and SEL_1. The following TABLE 2 illustrates delay encoding values of the signals SEL_0 and SEL_1:

TABLE 2

| SEL_1, SEL_0 | Delays (1× Clock Cycles) | Applied CAS Latency |
|---|---|---|
| 000 | 0 | 2 |
| 001 | 1 | 2, 2.5, 3 |
| 010 | 2 | 2.5, 3, 4 |
| 011 | 3 | 3, 4, 5 |
| 100 | 4 | 4, 5 |
| Others | 5 or 6 or 7 | N/A |

The adjusted delays may be varied from one to two 1× clock cycles over process, voltage and temperature (PVT) conditions. A training sequence may be needed to determine and set the optimal delay settings.

The following TABLE 3 summarizes the descriptions and connections of the circuit 100:

TABLE 3

| Signal | Type | Description | Connect To/From |
|---|---|---|---|
| CLK2X | IN | Twice the frequency of CLK1X | From PLL |
| CLK1X | IN | 1× clock input | From PLL or local 2× clock driver |
| SYSTEM_RESET | IN | Asynchronous, active low reset | From core logic |
| GATEON_RST_IN | IN | Used for resetting GATEON_INTN to inactive state after each training sequence | From core logic |
| MC_GATEON | IN | Level signal to enable the read data path inside the DP hardmacro | From core logic |
| SEL_0, SEL_1 | IN | Coarse delay settings for different CAS latency | From core logic |
| SEL_2 | IN | Medium delay settings for adjusting GATEON_INTN assertion timing | From core logic |
| SEL_3 | IN | Fine delay settings for adjusting GATEON_INTN assertion timing | From core logic |
| DQS_INTN | IN | Inverted DQS signal to control the deassertion of GATEON_INTN signal | From DP hardmac |
| GATEON_INTN | OUT | GATEON output control signal. Inactive state is 0. Will transition to 1 during the preamble of the read cycle. | To DP hardmacro |

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change the particular polarity of the signals.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
a first circuit having a plurality of first multiplexers and one or more second multiplexers configured to generate a first intermediate enable signal in response to (i) an input enable signal, (ii) a first clock signal operating at a first data rate and (iii) a plurality of first select signals, wherein each of said plurality of first multiplexers presents an output to each of said one or more second multiplexers;
a second circuit configured to generate a second intermediate enable signal in response to (i) said first intermediate enable signal, (ii) a second clock signal operating at a second data rate and (iii) a second select signal; and
a third circuit configured to generate a third intermediate enable signal in response to (i) said second intermediate enable signal, (ii) a control input signal and (iii) a third select signal, wherein said third intermediate enable signal is configured to control a read operation of a memory.

2. The apparatus according to claim 1, wherein said plurality of first select signals, said second select signal and said third select signal each comprise one or more control bits.

3. The apparatus according to claim 2, wherein one of said plurality of first select signals, said second select signal and said third select signal are implemented as a multibit select signal.

4. The apparatus according to claim 1, wherein said second circuit comprises a plurality of flip-flops coupled to one or more third multiplexers to generate said second intermediate enable signal.

5. The apparatus according to claim 1, wherein (i) said second circuit introduces a first delay in response to said second select signal and (ii) said third circuit introduces a second delay in response to said third select signal and said control input signal.

6. The apparatus according to claim 1, wherein said third intermediate enable signal is programmable.

7. The apparatus according to claim 1, wherein said apparatus compensates for propagation delays.

8. The apparatus according to claim 1, wherein said apparatus further comprises:
a hardmacro circuit configured to (i) produce a data strobe output signal and (ii) receive a data strobe input signal.

9. The apparatus according to claim 1, wherein said apparatus further comprises:
a softmacro circuit configured to (i) produce a data strobe output signal and (ii) receive a data strobe input signal.

10. The apparatus according to claim 8, wherein said apparatus further comprises:
a buffer circuit configured to transmit said data strobe output signal at a double speed clock rate.

11. The apparatus according to claim 10, wherein said apparatus further comprises:
a memory circuit configured to present said data strobe signal to said hardmacro circuit in response to a read operation.

12. The apparatus according to claim 8, wherein a data strobe input signal is disabled in response to said third intermediate enable signal to (i) prevent false data propagation and (ii) avoid unwanted noise.

13. The apparatus according to claim 1, wherein one of said plurality of first select signals is a delay encoded value applied to control one or more column address strobe (CAS) latencies.

14. The apparatus according to claim 11, wherein said third circuit comprises a plurality of delay elements configured to produce said second delay.

15. The apparatus according to claim 14, wherein said delay elements provide one or more granularities of delay adjustment to said second delay.

16. An apparatus comprising:
means for generating a first intermediate enable signal with a (i) plurality of first multiplexers and (ii) one or more second multiplexers in response to (a) an input enable signal, (b) a first clock signal operating at a first data rate and (c) a plurality of first select signals, wherein each of said plurality of first multiplexers presents an output to each of said one or more second multiplexers;

means for generating a second intermediate enable signal in response to (i) said first intermediate signal, (ii) a second clock signal operating at a second data rate and (iii) a second select signal; and means for generating a third intermediate enable signal in response to (i) said second intermediate enable signal, (ii) a control input signal and (iii) a third select signal, wherein said third intermediate enable signal is configured to control a read operation of a memory.

17. A method comprising the steps of:

(A) generating a first intermediate enable signal with (i) a plurality of first multiplexers and (ii) one or more second multiplexers in response to (a) an input enable signal, (b) a first clock signal operating at a first data rate and (c) a plurality of first select signals, wherein each of said plurality of first multiplexers presents an output to each of said one or more second multiplexers;

(B) generating a second intermediate enable signal in response to (i) said first intermediate enable signal, (ii) a second clock signal operating at a second data rate and (iii) a second select signal; and (C) generating a third intermediate enable signal in response to (i) said second intermediate enable signal, (ii) a control input signal and (iii) a third select signal, wherein said third intermediate enable signal is configured to control a read operation of a memory.

18. The method according to claim 17, further comprising the step of:
implementing one of said plurality of first select signals, said second select signal and said third select signal as a multibit select signal.

19. The method according to claim 17, wherein step (C) further comprises the step of:
disabling a data strobe input signal in response to said third intermediate enable signal to (i) prevent false data propagation and (ii) avoid unwanted noise.

20. The method according to claim 17 wherein step (C) further comprises the step of:
generating one or more granularities of delay adjustment with a plurality of delay elements.

* * * * *